(12) United States Patent
Shinozaki

(10) Patent No.: US 10,661,409 B2
(45) Date of Patent: May 26, 2020

(54) SUBSTRATE CLEANING APPARATUS, SUBSTRATE PROCESSING APPARATUS, AND SUBSTRATE CLEANING METHOD

(71) Applicant: EBARA CORPORATION, Tokyo (JP)

(72) Inventor: Hiroyuki Shinozaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 281 days.

(21) Appl. No.: 14/940,741

(22) Filed: Nov. 13, 2015

(65) Prior Publication Data

US 2016/0136775 A1    May 19, 2016

(30) Foreign Application Priority Data

Nov. 18, 2014  (JP) .................................. 2014-234007

(51) Int. Cl.
| | | |
|---|---|---|
| *B24B 37/20* | (2012.01) | |
| *B08B 7/02* | (2006.01) | |
| *H01L 21/67* | (2006.01) | |
| *B08B 3/02* | (2006.01) | |

(52) U.S. Cl.
CPC .............. *B24B 37/20* (2013.01); *B08B 3/024* (2013.01); *B08B 7/028* (2013.01); *H01L 21/67051* (2013.01)

(58) Field of Classification Search
CPC .. B08B 3/12; B08B 3/02; B24B 37/04; B24B 37/042
USPC .......................................................... 134/1.3
See application file for complete search history.

(56) References Cited

U.S. PATENT DOCUMENTS

| | | | | |
|---|---|---|---|---|
| 4,195,243 A | * | 3/1980 | Thaxter ................ | H02N 2/0095 250/442.11 |
| 5,927,308 A | * | 7/1999 | Kim ......................... | B08B 3/12 134/144 |
| 6,385,805 B2 | * | 5/2002 | Konishi .................... | B08B 1/04 134/902 |
| 6,766,813 B1 | * | 7/2004 | Sayka ....................... | B08B 3/02 134/148 |
| 2012/0318304 A1 | * | 12/2012 | Wang ................ | H01L 21/67051 134/33 |

FOREIGN PATENT DOCUMENTS

| | | |
|---|---|---|
| JP | 2003-024889 A | 1/2003 |
| JP | 2007-027241 A | 2/2007 |
| JP | 2008-147296 A | 6/2008 |
| JP | 2008147296 A * | 6/2008 |
| JP | 2013-021160 A | 1/2013 |
| JP | 2014-017466 A | 1/2014 |
| JP | 2014-067864 A | 4/2014 |
| WO | WO 2007/108315 A1 | 9/2007 |

OTHER PUBLICATIONS

Machine Translation of JP2008147296A.*

* cited by examiner

*Primary Examiner* — George B Nguyen
(74) *Attorney, Agent, or Firm* — BakerHostetler

(57) ABSTRACT

A substrate cleaning apparatus capable of removing fine particles from a substrate, such as a wafer, without using a chemical liquid is disclosed. The substrate cleaning apparatus includes: a substrate supporting structure for supporting the substrate; a vibration device secured to the substrate supporting structure; a vibration controller configured to cause the vibration device to vibrate at a natural frequency of the substrate; and a cleaning liquid supply nozzle configured to supply a cleaning liquid onto the substrate.

16 Claims, 14 Drawing Sheets

SUBSTRATE CLEANING APPARATUS, SUBSTRATE PROCESSING APPARATUS, AND SUBSTRATE CLEANING METHOD

CROSS REFERENCE TO RELATED APPLICATION

This document claims priority to Japanese Patent Application Number 2014-234007 filed Nov. 18, 2014, the entire contents of which are hereby incorporated by reference.

BACKGROUND

A CMP (Chemical Mechanical Polishing) apparatus is a device for chemically mechanically polishing a substrate, such as a wafer. The CMP apparatus is configured to provide sliding contact between a wafer and a polishing pad while supplying a polishing liquid onto the polishing pad to thereby polish a surface of the wafer by a combination of a mechanical action of abrasive grains contained in the polishing liquid and a chemical action of the polishing liquid.

Fine particles, such as polishing debris and the abrasive grains, are attached to the surface of the polished wafer. Therefore, in order to remove such fine particles from the wafer surface, the CMP apparatus typically has a cleaning unit for cleaning the wafer. A typical cleaning unit is configured to clean the surface of the wafer with a jet of pure water. However, it is difficult to remove the fine particles from the surface of the wafer by the jet of pure water.

Thus, there is a method of cleaning a surface of a wafer using a chemical liquid in place of pure water. According to this cleaning method, a zeta potential of the particles is changed by the supply of the chemical liquid onto the wafer, so that an attracting force acting between the wafer surface and the particles is weakened. Thereafter, rinsing water is supplied onto the wafer to wash away the particles from the wafer surface. This cleaning method using the chemical liquid has been often used because of its high removal efficiency of the particles. However, since the chemical liquid contains components which are harmful to human body, use of the chemical liquid entails a heavy burden on its handling and treatment.

SUMMARY OF THE INVENTION

According to embodiments, there are provided a substrate cleaning apparatus and a substrate cleaning method capable of removing fine particles from a substrate, such as a wafer, without using a chemical liquid. Further, according to an embodiment, there is provided a substrate processing apparatus including such a substrate cleaning apparatus.

Embodiments, which will be described below, relate to a substrate cleaning apparatus and a substrate cleaning method for cleaning a substrate, such as a wafer. Further, embodiments, which will be described below, relate to a substrate processing apparatus including the substrate cleaning apparatus. The substrate cleaning apparatus and the substrate cleaning method according to the embodiments are applicable to cleaning of not only a wafer having a diameter of 300 mm but also a wafer having a diameter of 450 mm, and are further applicable to a manufacturing process of a flat panel, a manufacturing process of an image sensor, such as CMOS and CCD, a manufacturing process of a magnetic film for MRAM, and other processes.

In an embodiment, there is provided a substrate cleaning apparatus comprising: a substrate supporting structure configured to support a substrate; a vibration device secured to the substrate supporting structure; a vibration controller configured to cause the vibration device to vibrate at a natural frequency of the substrate; and a cleaning liquid supply nozzle configured to supply a cleaning liquid onto the substrate.

In an embodiment, the substrate supporting structure has a pillar for supporting a periphery of the substrate, and the vibration device is secured to the pillar.

In an embodiment, the substrate supporting structure has a pillar for supporting a periphery of the substrate and a base to which the pillar is secured, and the vibration device is secured to the base.

In an embodiment, the vibration controller is configured to continuously change a vibration frequency of the vibration device over a frequency band including a plurality of natural frequencies of the substrate.

In an embodiment, the substrate cleaning apparatus further comprises a natural frequency detector configured to detect the natural frequency of the substrate when the substrate is supported by the substrate supporting structure.

In an embodiment, the natural frequency detector includes a vibration detector secured to the substrate supporting structure, and a natural frequency determiner configured to determine the natural frequency of the substrate based on an amplitude of a vibration detected by the vibration detector, and the vibration controller is configured to cause the vibration device to vibrate at the detected natural frequency.

In an embodiment, there is provided a substrate cleaning apparatus comprising: a substrate supporting structure configured to support a substrate; a vibration plate opposed to the substrate when the substrate is supported by the substrate supporting structure; a vibration device secured to the vibration plate and configured to vibrate the substrate through a gas existing between the vibration plate and a surface of the substrate; a vibration controller configured to cause the vibration device to vibrate at a natural frequency of the substrate; and a cleaning liquid supply nozzle configured to supply a cleaning liquid onto the substrate.

In an embodiment, the vibration controller is configured to continuously change a vibration frequency of the vibration device over a frequency band including a plurality of natural frequencies of the substrate.

In an embodiment, the substrate cleaning apparatus further comprises a natural frequency detector configured to detect the natural frequency of the substrate when the substrate is supported by the substrate supporting structure.

In an embodiment, the natural frequency detector includes a vibration detector secured to the substrate supporting structure, and a natural frequency determiner configured to determine the natural frequency of the substrate based on an amplitude of a vibration detected by the vibration detector, and the vibration controller is configured to cause the vibration device to vibrate at the detected natural frequency.

In an embodiment, there is provided a substrate processing apparatus comprising: a polishing unit configured to polish a substrate; a cleaning unit configured to clean the substrate; the substrate cleaning apparatus; and a transporting mechanism configured to transport the substrate from the polishing unit to the substrate cleaning apparatus and from the substrate cleaning apparatus to the cleaning unit.

In an embodiment, there is provided a substrate processing apparatus comprising: a polishing unit configured to polish a substrate; a cleaning unit configured to clean the substrate, the cleaning unit comprising the substrate cleaning apparatus; and a transporting mechanism configured to transport the substrate from the polishing unit to the cleaning unit.

In an embodiment, there is provided a substrate cleaning method comprising: supporting a substrate with a substrate supporting structure; causing a vibration device, which is secured to the substrate supporting structure, to vibrate at a natural frequency of the substrate; and supplying a cleaning liquid onto the substrate.

In an embodiment, causing the vibration device to vibrate at the natural frequency of the substrate comprises causing the vibration device to vibrate while continuously changing a vibration frequency of the vibration device over a frequency band including a plurality of natural frequencies of the substrate.

In an embodiment, the substrate cleaning method further comprises detecting the natural frequency of the substrate when the substrate is supported by the substrate supporting structure.

In an embodiment, detecting the natural frequency of the substrate comprises: causing the vibration device to vibrate while changing its vibration frequency; detecting a vibration of the substrate supporting structure; and determining the natural frequency of the substrate based on an amplitude of the detected vibration, wherein causing the vibration device to vibrate at the natural frequency of the substrate comprises causing the vibration device to vibrate at the detected natural frequency.

In an embodiment, there is provided a substrate cleaning method comprising: supporting a substrate by a substrate supporting structure, with a surface of the substrate opposed to a vibration plate; causing a vibration device, which is secured to the vibration plate, to vibrate at a natural frequency of the substrate, thereby vibrating the substrate through a gas existing between the vibration plate and the surface of the substrate; and supplying a cleaning liquid onto the substrate.

In an embodiment, causing the vibration device to vibrate at the natural frequency of the substrate comprises causing the vibration device to vibrate while continuously changing a vibration frequency of the vibration device over a frequency band including a plurality of natural frequencies of the substrate.

In an embodiment, the substrate cleaning method further comprises detecting the natural frequency of the substrate when the substrate is supported by the substrate supporting structure.

In an embodiment, detecting the natural frequency of the substrate comprises: causing the vibration device to vibrate while changing its vibration frequency; detecting a vibration of the substrate supporting structure; and determining the natural frequency of the substrate based on an amplitude of the detected vibration, wherein causing the vibration device to vibrate at the natural frequency of the substrate comprises causing the vibration device to vibrate at the detected natural frequency.

According to the above-described embodiments, the substrate is forced to vibrate by the vibration device through the substrate supporting structure or the gas. Fine particles, attached to the substrate, are separated from the substrate as a result of excitation of the substrate, and are washed away by the cleaning liquid. Since a chemical liquid for weakening an attracting force acting between the particles and the substrate is not necessary, pure water can be used as the cleaning liquid. Therefore, cleaning of the substrate can be performed without causing environmental pollution.

Further, according to the above-described embodiments, the substrate can be cleaned in a gaseous atmosphere. Therefore, the substrate cleaning apparatus can be installed in an existing transportation route. For example, the substrate cleaning apparatus can be manufactured using a temporary placement stage (or a buffer station) which has already been installed. In particular, it is not necessary to provide a bath for immersing the substrate in a liquid or a mechanism for immersing the substrate in the liquid. Therefore, the substrate cleaning apparatus can be installed in a small space at a low cost.

DESCRIPTION OF EMBODIMENTS

Figure 1:
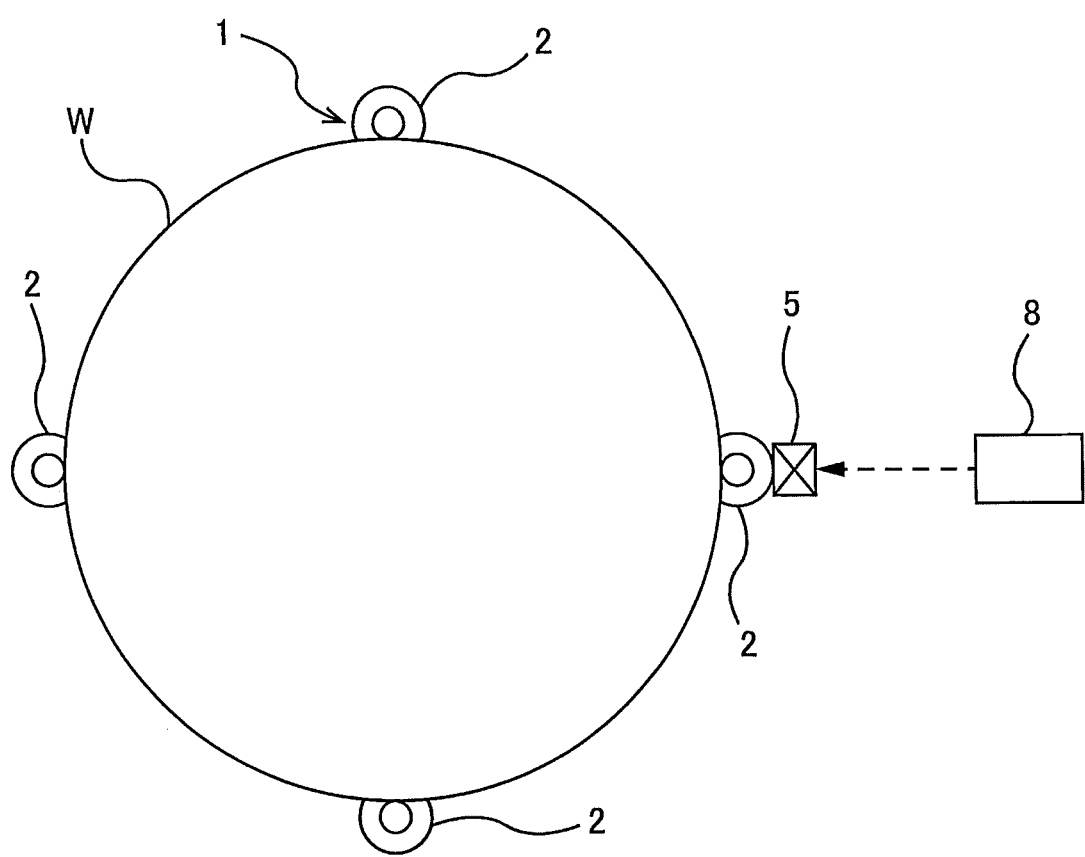
FIG. 1 is a plan view of a substrate cleaning apparatus according to an embodiment.
Figure 2:
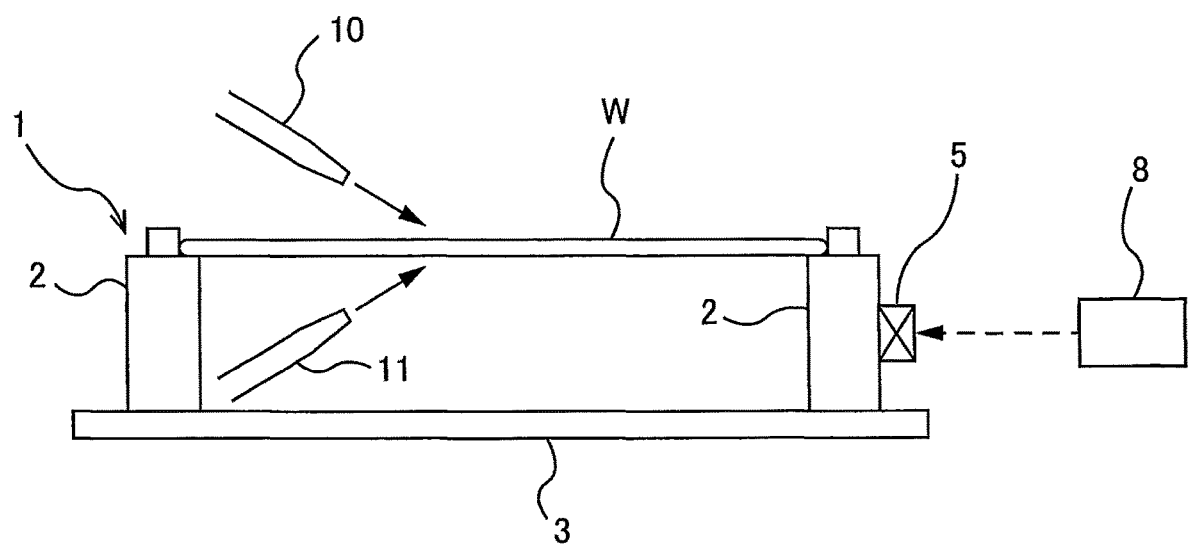
FIG. 2 is a side view of the substrate cleaning apparatus shown in FIG. 1.

Embodiments will now be described with reference to the drawings. FIG. 1 is a plan view of a substrate cleaning apparatus according to an embodiment, and FIG. 2 is a side view of the substrate cleaning apparatus shown in FIG. 1. The substrate cleaning apparatus includes a substrate supporting structure 1 for supporting a wafer W, which is an example of a substrate, a vibration device 5 secured to the substrate supporting structure 1, a vibration controller 8 configured to control an operation of the vibration device 5, and a cleaning liquid supply nozzle 10 for supplying a cleaning liquid onto a surface of the wafer W.

The substrate supporting structure 1 includes a plurality of pillars 2 for supporting a periphery of the wafer W, and a base 3 to which the pillars 2 are fixed. In this embodiment, four pillars 2 are provided, while the number of pillars 2 may be more than four. The wafer W is placed on the pillars 2 of the substrate supporting structure 1 by a transporting mechanism, which will be described later. A rotating device is not coupled to the substrate supporting structure 1. Therefore, the substrate supporting structure 1 and the wafer W are not rotated.

The vibration device 5 is secured to one of the four pillars 2. A plurality of vibration devices 5 may be secured to the pillars 2. The vibration device 5 may be a piezoelectric element, an electrostrictive element, an acoustic-wave generator, an ultrasonic transducer, a vibration speaker, or the like. The vibration device 5 is configured to cause the pillar 2 to vibrate, so that the wafer W is forced to vibrate by the vibration device 5 through the pillar 2.

The vibration device 5 is coupled to the vibration controller 8. This vibration controller 8 is configured to control a vibration frequency of the vibration device 5. More specifically, the vibration controller 8 is configured to cause the vibration device 5 to vibrate at a natural frequency of the wafer W. The vibration device 5 causes the wafer W to vibrate at a natural frequency of the wafer W supported by the substrate supporting structure 1, thereby causing resonance of the wafer W. As a result, fine particles, attached to the wafer W, can be separated from the wafer W.

Figure 3:
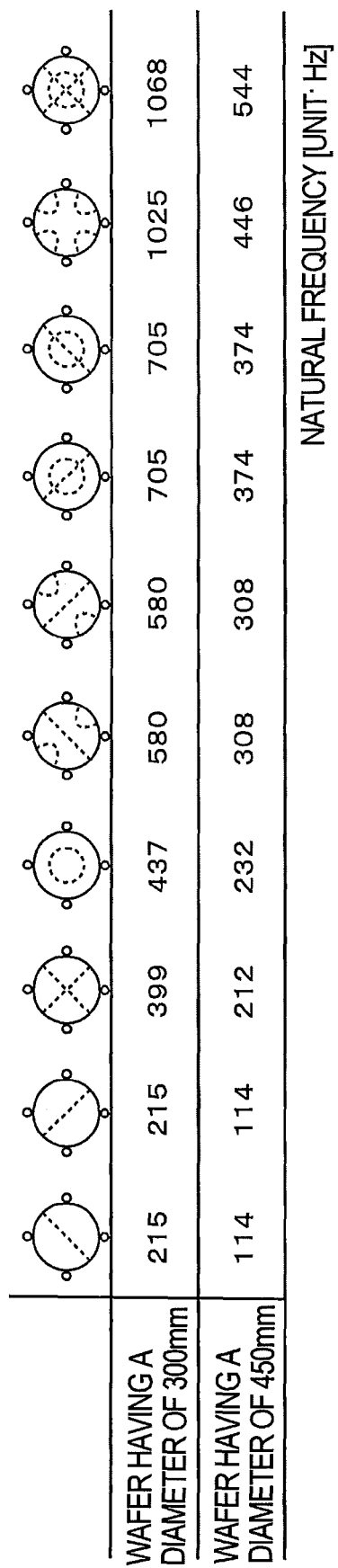
FIG. 3 is a schematic view showing natural frequency and mode of vibration of a wafer formed of a single crystal silicon.

FIG. 3 is a schematic view showing natural frequency and mode of vibration of the wafer formed of a single crystal silicon. In FIG. 3, dotted lines drawn on wafers represent antinodes of standing waves that appear in wafers when they are vibrating at each natural frequency. As shown in FIG. 3, there exist a number of natural frequencies of the wafer W. The natural frequencies can be calculated based on factors including a diameter of the wafer W, Young's modulus, and Poisson's ratio. The wafer W vibrates at each natural frequency with a different mode of vibration. The vibration controller 8 stores in advance at least one natural frequency of the wafer W, and is configured to cause the vibration device 5 to vibrate at the natural frequency of the wafer W.

As shown in FIG. 3, when the mode of vibration is different, a standing wave with a different shape appears in the wafer W. Therefore, the vibration controller 8 preferably stores in advance a plurality of natural frequencies of the wafer W. In this case, the vibration controller 8 may change the vibration frequency of the vibration device 5 from a certain natural frequency to another natural frequency during cleaning of the wafer W. Further, the vibration controller 8 may continuously change (or sweep) the vibration frequency of the vibration device 5 over a predetermined frequency band including the natural frequencies during cleaning of the wafer W. By vibrating the wafer W at different natural frequencies, the wafer W resonates with different modes of vibration. Therefore, the particles, separated from the wafer W, can move on the wafer W by the vibration of the wafer W.

As shown in FIG. 2, the cleaning liquid supply nozzle 10 is disposed above the substrate supporting structure 1, and supplies the cleaning liquid onto the surface (upper surface) of the wafer W supported by the substrate supporting structure 1. Since the particles are separated from the wafer W by the vibration of the wafer W, it is not necessary to use a chemical liquid for separating the particles from the wafer W. Therefore, pure water can be used as the cleaning liquid. When the vibration device 5 is vibrating the wafer W, the cleaning liquid supply nozzle 10 preferably supplies the cleaning liquid (e.g., pure water) onto the surface of the wafer W, so that the particles that have been separated from the wafer W can be washed away from the wafer W by the cleaning liquid. As shown in FIG. 2, a cleaning liquid supply nozzle 11 for supplying a cleaning liquid onto a back surface (lower surface) of the wafer W supported by the substrate supporting structure 1 may further be provided.

Figure 4:
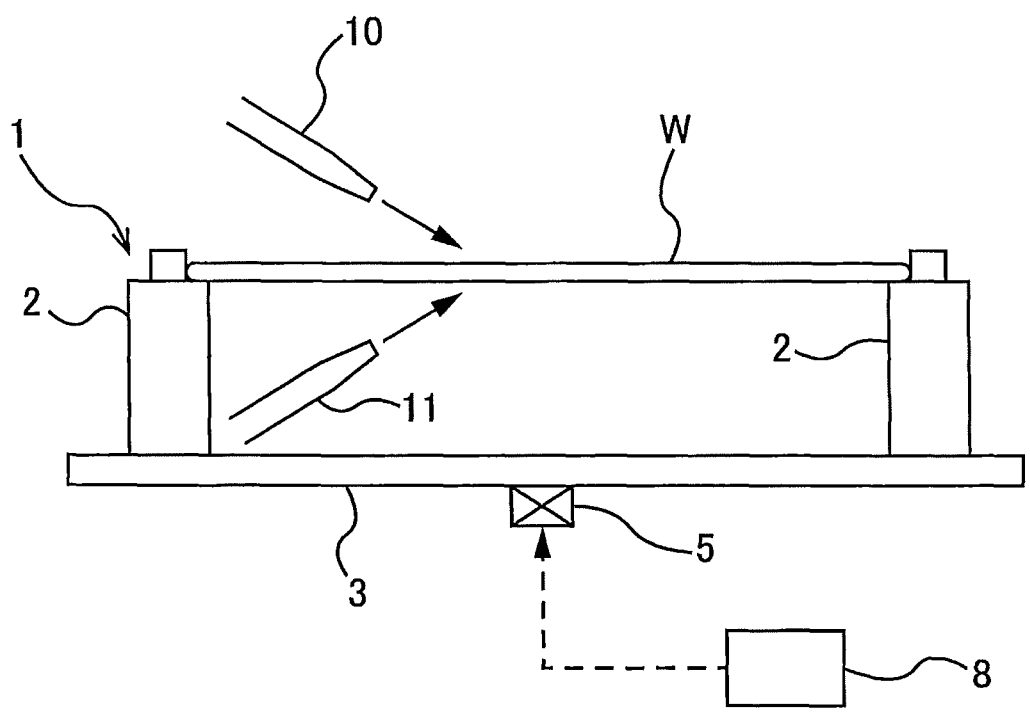
FIG. 4 is a side view showing another embodiment of the substrate cleaning apparatus.

FIG. 4 is a side view showing another embodiment of the substrate cleaning apparatus. Structures and operations which are identical to those of the embodiment shown in FIG. 1 and FIG. 2 will not be described below, and their repetitive explanations are omitted. In this embodiment, the vibration device 5 is secured to the base 3 of the substrate supporting structure 1. The base 3 may have a circular shape or a polygonal shape. The vibration device 5 vibrates all of the pillars 2 simultaneously by vibrating the base 3, thereby vibrating the wafer W.

Figure 5:
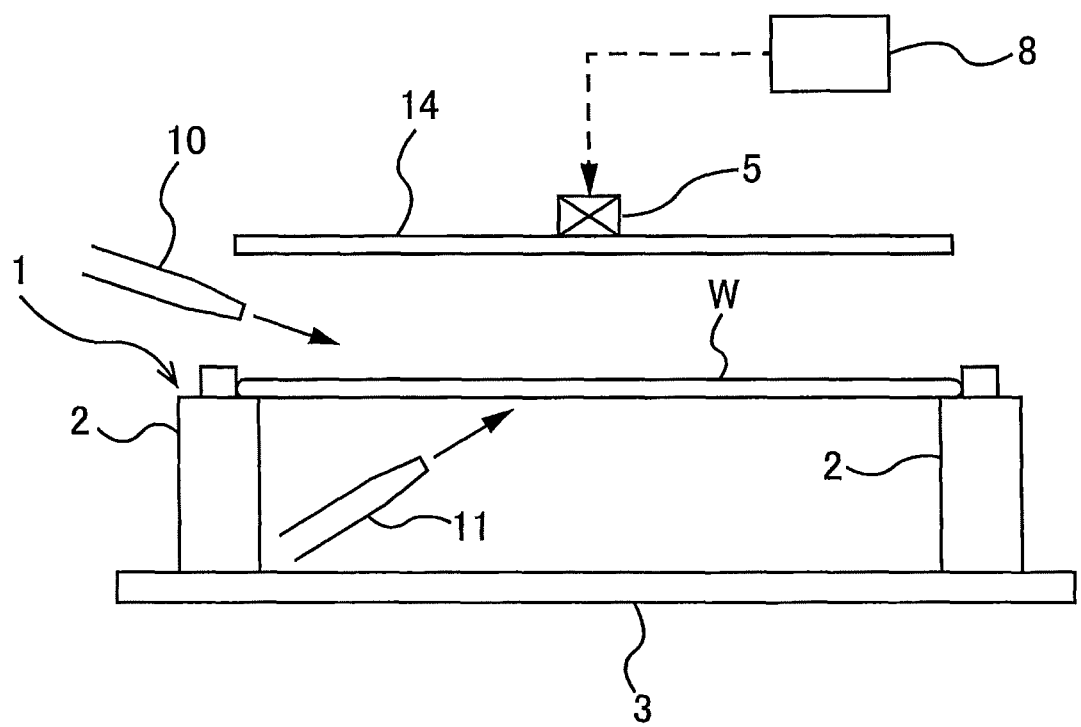
FIG. 5 is a side view showing still another embodiment of the substrate cleaning apparatus.

FIG. 5 is a side view showing still another embodiment of the substrate cleaning apparatus. Structures and operations which are identical to those of the embodiment shown in FIG. 1 and FIG. 2 will not be described below, and their repetitive explanations are omitted. In this embodiment, a vibration plate 14 is disposed above the substrate supporting structure 1. This vibration plate 14 has approximately the same shape as the wafer W. For example, the vibration plate 14 has a circular shape, and its diameter is the same as the diameter of the wafer W or larger than the diameter of the wafer W. The vibration plate 14 is disposed opposite to the surface of the wafer W when the wafer W is supported by the substrate supporting structure 1. The vibration device 5 is secured to the vibration plate 14. The vibration plate 14 is preferably parallel to the wafer W on the substrate supporting structure 1.

When the vibration device 5 causes the vibration plate 14 to vibrate, the vibration of the vibration plate 14 is transmitted to the wafer W through a gas (generally air) which is present between the vibration plate 14 and the wafer W. As a result, the wafer W vibrates. In this manner, according to this embodiment, the vibration device 5 can force the wafer W to vibrate through the gas existing between the vibration plate 14 and the wafer W.

Figure 6:
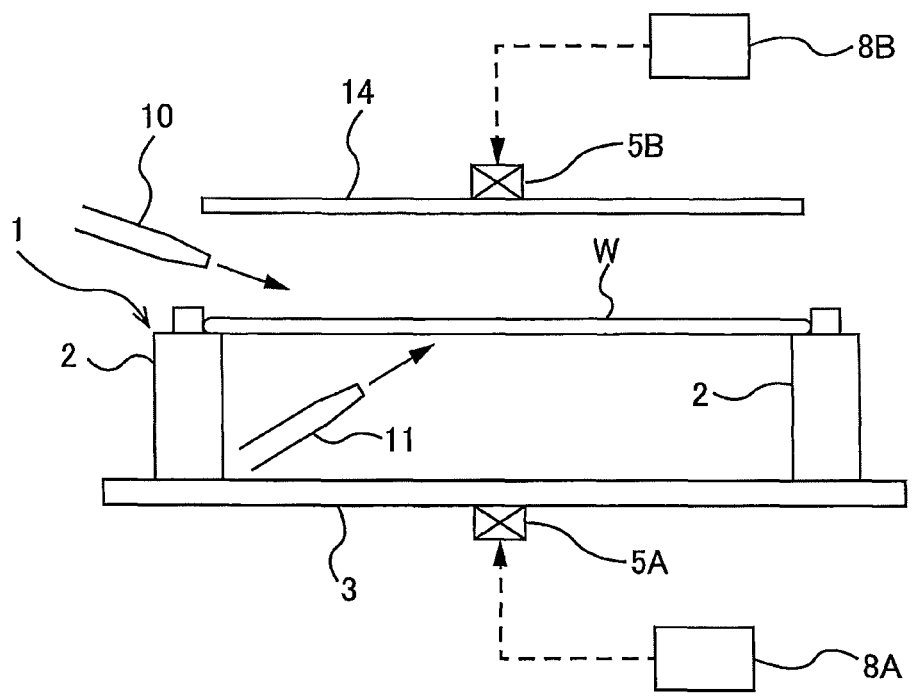
FIG. 6 is a side view showing still another embodiment of the substrate cleaning apparatus.

FIG. 6 is a side view showing still another embodiment of the substrate cleaning apparatus. The substrate cleaning apparatus according to this embodiment includes the vibration device 5 shown in FIG. 4 and the vibration plate 14 and the vibration device 5 shown in FIG. 5. In the following descriptions, the vibration device 5 secured to the base 3 of the substrate supporting structure 1 will be referred to as a first vibration device 5A, and the vibration device 5 disposed above the wafer W will be referred to as a second vibration device 5B. A first vibration controller 8A is coupled to the first vibration device 5A, and a second vibration controller 8B is coupled to the second vibration device 5B. Operations of the first vibration controller 8A and the second vibration controller 8B are the same as the operation of the vibration controller 8 set forth above.

According to the embodiment, the vibrations are transmitted to the wafer W from above and below the wafer W. The second vibration controller 8B preferably causes the second vibration device 5B to vibrate at a phase different from a phase of the vibration of the first vibration device 5A so that the vibration generated by the first vibration device 5A and the vibration generated by the second vibration device 5B do not cancel each other. The second vibration controller 8B may cause the second vibration device 5B to vibrate at the vibration frequency which is different from the vibration frequency of the first vibration device 5A.

In the embodiment shown in FIG. 6, the first vibration device 5A is secured to the base 3 of the substrate supporting structure 1, but the first vibration device 5A may be secured to the pillar 2 of the substrate supporting structure 1.

Figure 7:
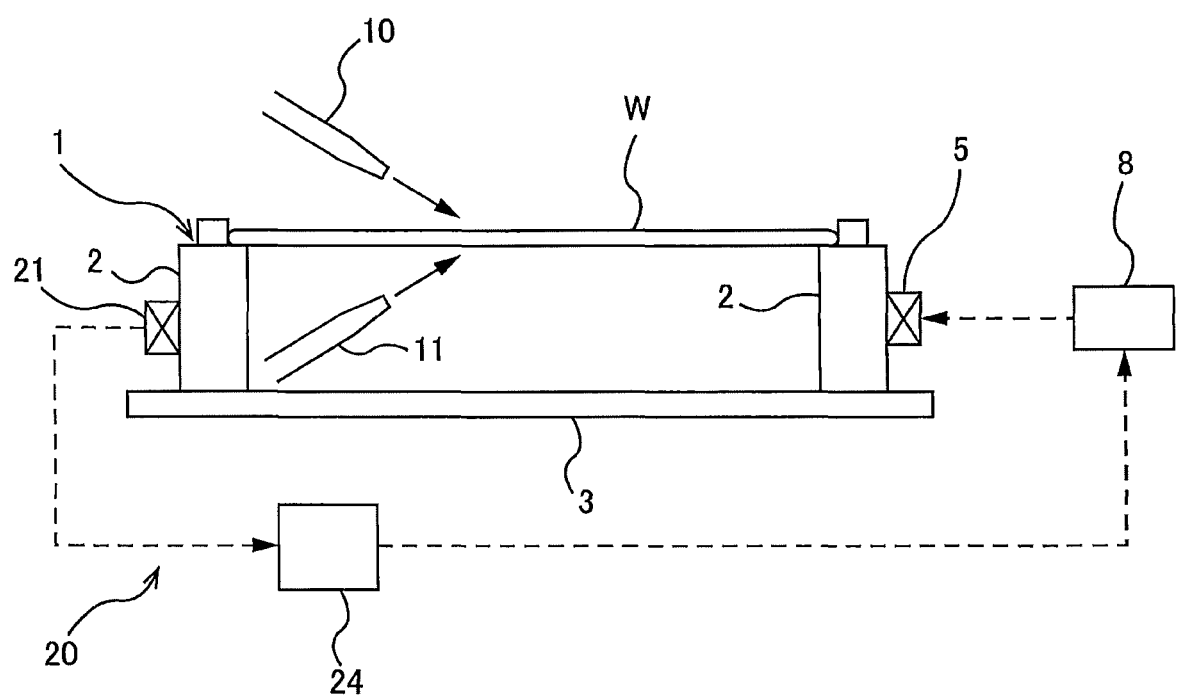
FIG. 7 is a side view showing still another embodiment of the substrate cleaning apparatus.

FIG. 7 is a side view showing still another embodiment of the substrate cleaning apparatus. Structures and operations which are identical to those of the embodiment shown in FIG. 1 and FIG. 2 will not be described below, and their repetitive explanations are omitted. The substrate cleaning apparatus of this embodiment further includes a natural frequency detector 20 configured to detect the natural frequency of the wafer W when the wafer W is supported by the substrate supporting structure 1. This natural frequency detector 20 has a vibration detector 21 secured to the substrate supporting structure 1, and a natural frequency determiner 24 configured to determine the natural frequency of the wafer W based on an amplitude of a vibration detected by the vibration detector 21.

The vibration detector 21 is secured to the pillar 2. As shown in FIG. 7, the vibration detector 21 is preferably secured to the pillar 2 which is different from the pillar 2 to which the vibration device 5 is secured. The piezoelectric element, a load cell, a strain gauge, or a crystal may be used as the vibration detector 21. The vibration detector 21 is coupled to the natural frequency determiner 24, and is configured to send a signal, indicating the frequency and the amplitude of the vibration, to the natural frequency determiner 24.

The natural frequency is determined as follows. When the wafer W is supported by the substrate supporting structure 1, the vibration controller 8 causes the vibration device 5 to vibrate while changing its vibration frequency, while the vibration detector 21 detects the vibration of the substrate supporting structure 1. When the wafer W is vibrating at its natural frequency, the substrate supporting structure 1 vibrates largely. Therefore, the natural frequency determiner 24 can determine the natural frequency at which the amplitude of the vibration detected by the vibration detector 21 is maximized (i.e., locally maximized).

The detection of the natural frequency is performed after the wafer W is placed on the substrate supporting structure 1 and before cleaning of the wafer W is started. The natural frequency of the wafer W can be determined by the calculation. However, an actual natural frequency may be slightly different from the calculated natural frequency. According to this embodiment, the actual natural frequency of the wafer W is detected with the wafer W placed on the substrate supporting structure 1. The detected natural frequency is sent to the vibration controller 8. When the wafer W is being cleaned, the vibration controller 8 causes the vibration device 5 to vibrate at the detected natural frequency, thereby causing the resonance of the wafer W. In this embodiment, it is not necessary to calculate the natural frequency of the wafer W in advance.

The natural frequency detector 20 may be provided in the embodiments shown in FIGS. 4 through 6. The vibration detector 21 of the natural frequency detector 20 may be secured to the base 3 of the substrate supporting structure 1.

Figure 8:
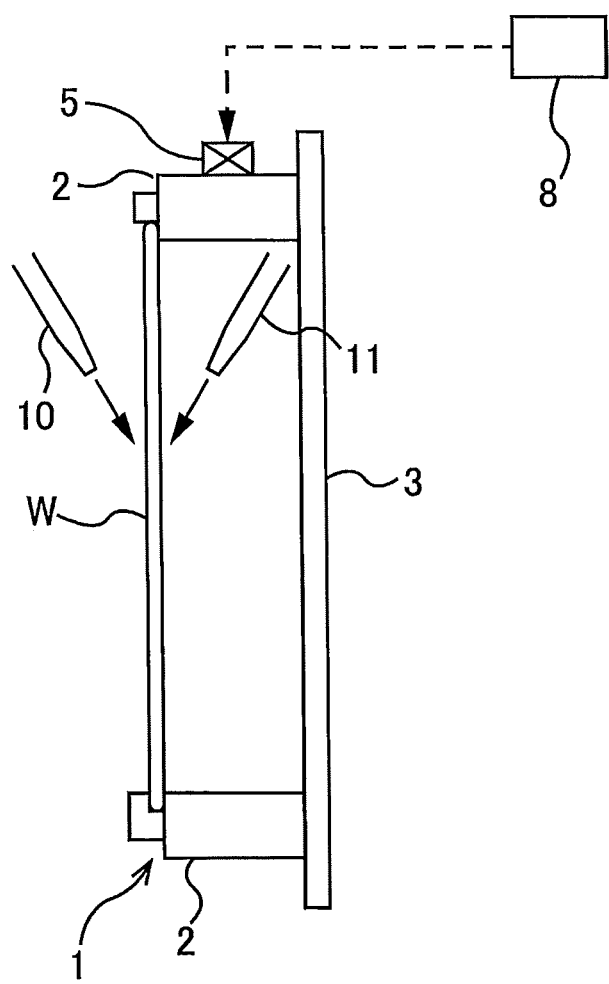
FIG. 8 is a side view showing still another embodiment of the substrate cleaning apparatus.
Figure 9:
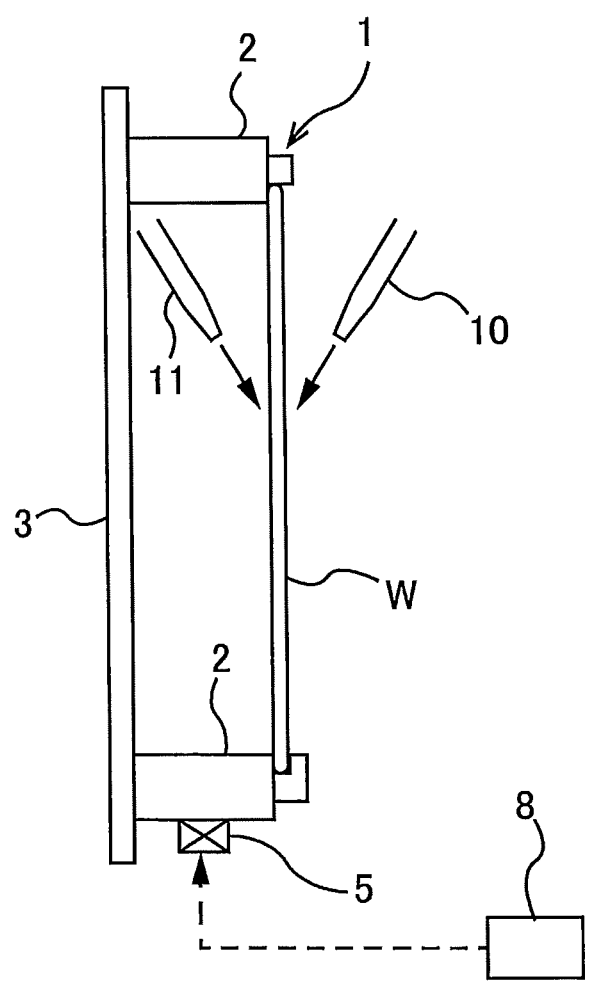
FIG. 9 is a side view showing still another embodiment of the substrate cleaning apparatus.
Figure 10:
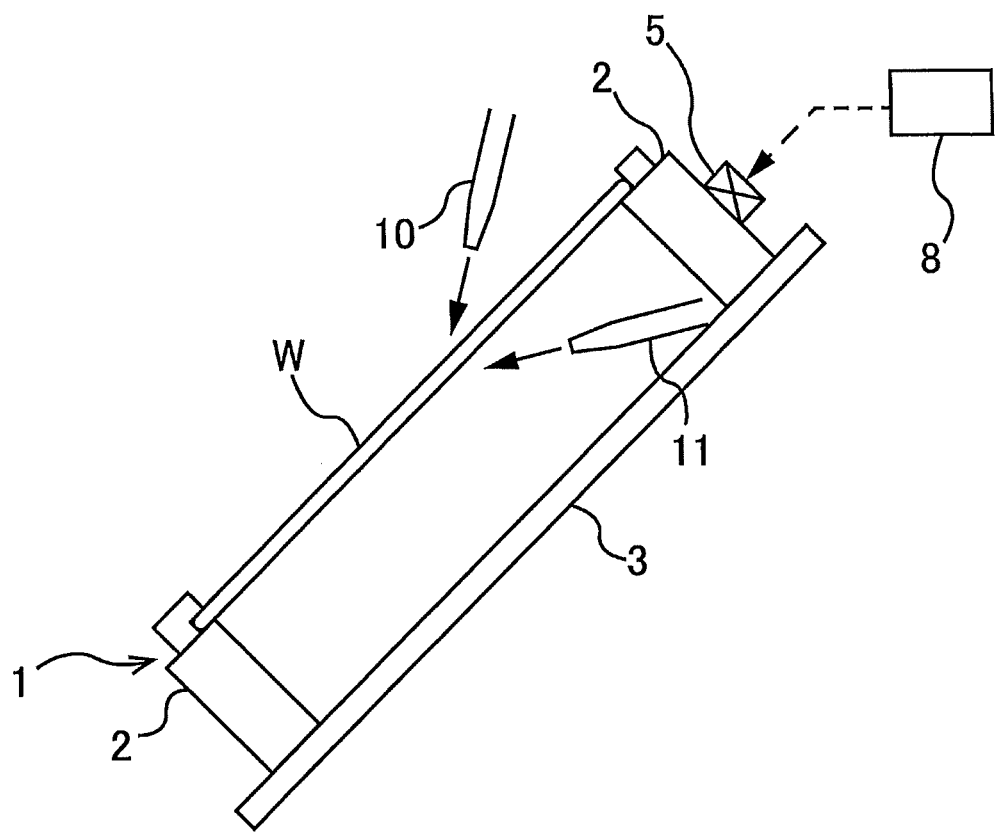
FIG. 10 is a side view showing still another embodiment of the substrate cleaning apparatus.
Figure 11:
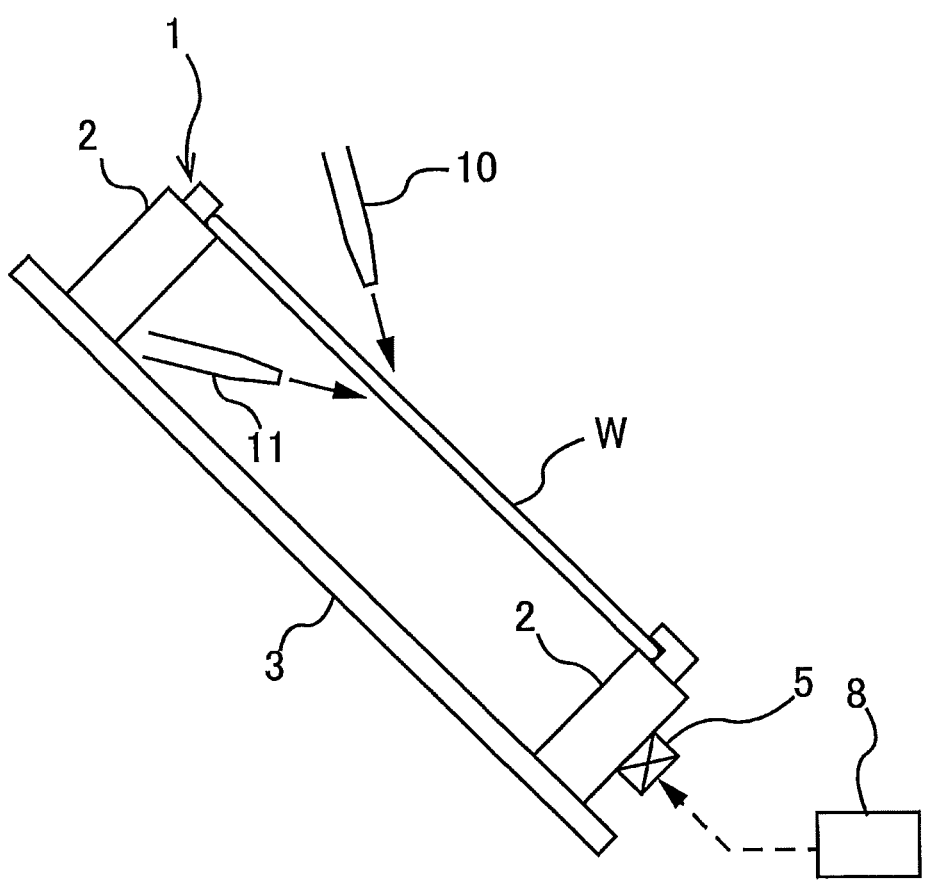
FIG. 11 is a side view showing still another embodiment of the substrate cleaning apparatus.

The substrate supporting structure 1 in the above-described embodiments is configured to horizontally support the wafer W. However, the present invention is not limited to the above-described embodiments. For example, as shown in FIG. 8 and FIG. 9, the substrate supporting structure 1 may be configured to vertically support the wafer W, or as shown in FIG. 10 and FIG. 11, the substrate supporting structure 1 may be configured to diagonally support the wafer W.

Figure 12:
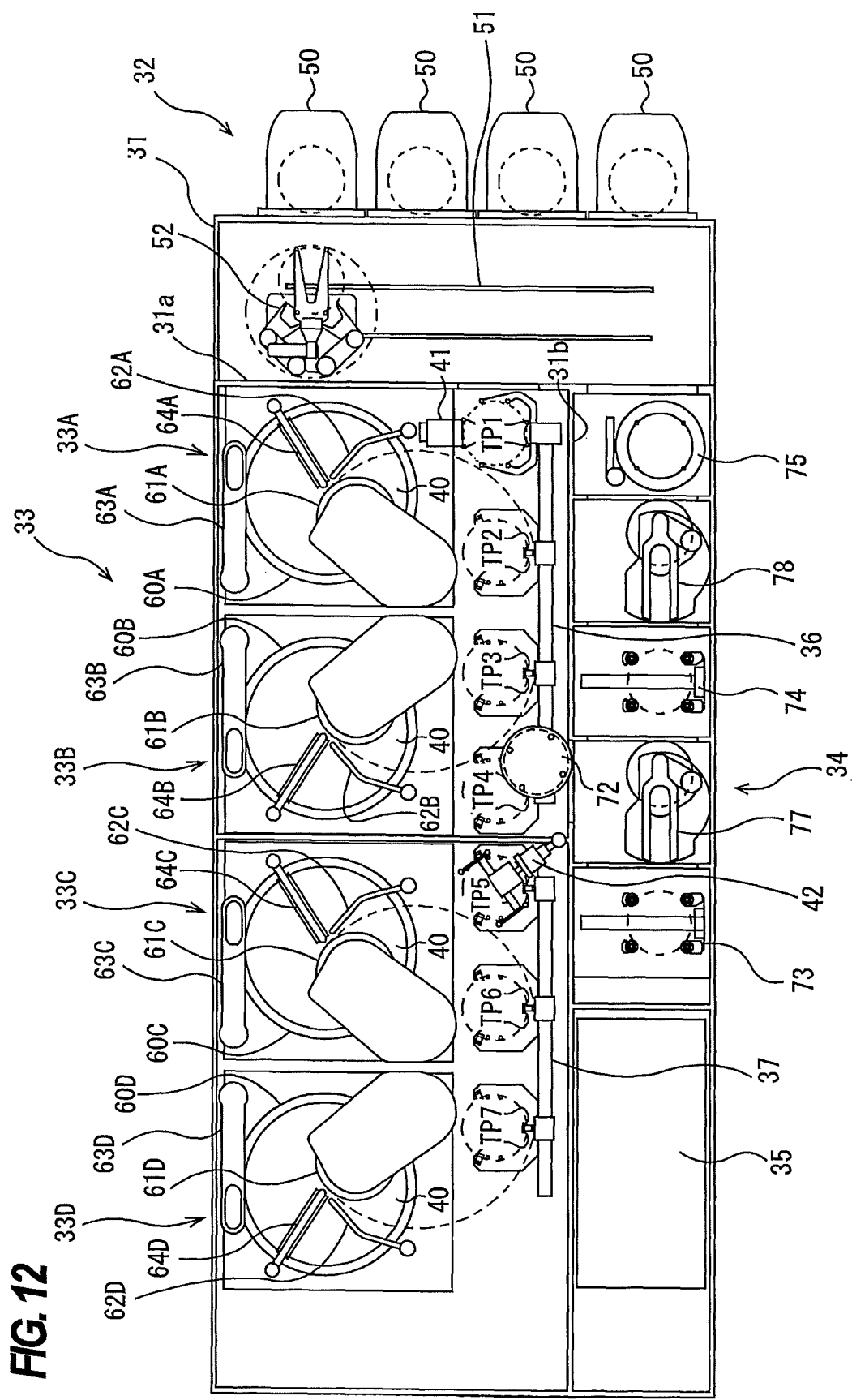
FIG. 12 is a view showing a substrate processing apparatus including the substrate cleaning apparatus according to any one of the above-described embodiments.

FIG. 12 is a view showing a substrate processing apparatus including the substrate cleaning apparatus according to any one of the above-described embodiments. The substrate processing apparatus, which will be described below, is a polishing apparatus which chemically mechanically polishes a wafer, which is an example of the substrate, cleans the polished wafer, and dries the cleaned wafer. The polishing apparatus is referred to as a CMP (Chemical Mechanical Polishing) apparatus. As shown in FIG. 12, this substrate processing apparatus has a housing 31 in approximately a rectangular shape. An interior space of the housing 31 is divided by partitions 31a and 31b into a load-unload section 32, a polishing section 33, and a cleaning section 34. The substrate processing apparatus includes an operation controller 35 configured to control wafer processing operations.

The load-unload section 32 has front load sections 50 on which substrate cassettes are placed, respectively. A plurality of wafers (substrates) are stored in each substrate cassette. The load-unload section 32 has a moving mechanism 51 extending along an arrangement direction of the front load sections 50. A transfer robot (or a loader) 52 is provided on the moving mechanism 51, so that the transfer robot 52 can move along the arrangement direction of the substrate cassettes. The transfer robot 52 moves on the moving mechanism 51 so as to be able to access the substrate cassettes mounted on the front load sections 50.

The polishing section 33 is an area where a wafer is polished. This polishing section 33 includes a first polishing unit 33A, a second polishing unit 33B, a third polishing unit 33C, and a fourth polishing unit 33D. As shown in FIG. 12, the first polishing unit 33A includes a first polishing table 60A to which a polishing pad 40, having a polishing surface, is attached, a polishing head 61A for holding a wafer and pressing the wafer against the polishing pad 40 on the first polishing table 60A so as to polish the wafer, a first polishing liquid supply nozzle 62A for supplying a polishing liquid (e.g., slurry) and a dressing liquid (e.g., pure water) onto the polishing pad 40, a first dresser 63A for dressing the polishing surface of the polishing pad 40, and a first atomizer 64A for ejecting a mixture of a liquid (e.g., pure water) and a gas (e.g., nitrogen gas) in an atomized state onto the polishing surface.

Similarly, the second polishing unit 33B includes a second polishing table 60B to which a polishing pad 40 is attached, a polishing head 61B, a second polishing liquid supply nozzle 62B, a second dresser 63B, and a second atomizer 64B. The third polishing unit 33C includes a third polishing table 60C to which a polishing pad 40 is attached, a polishing head 61C, a third polishing liquid supply nozzle 62C, a third dresser 63C, and a third atomizer 64C. The fourth polishing unit 33D includes a fourth polishing table 60D to which a polishing pad 40 is attached, a polishing head 61D, a fourth polishing liquid supply nozzle 62D, a fourth dresser 63D, and a fourth atomizer 64D.

Figure 13:
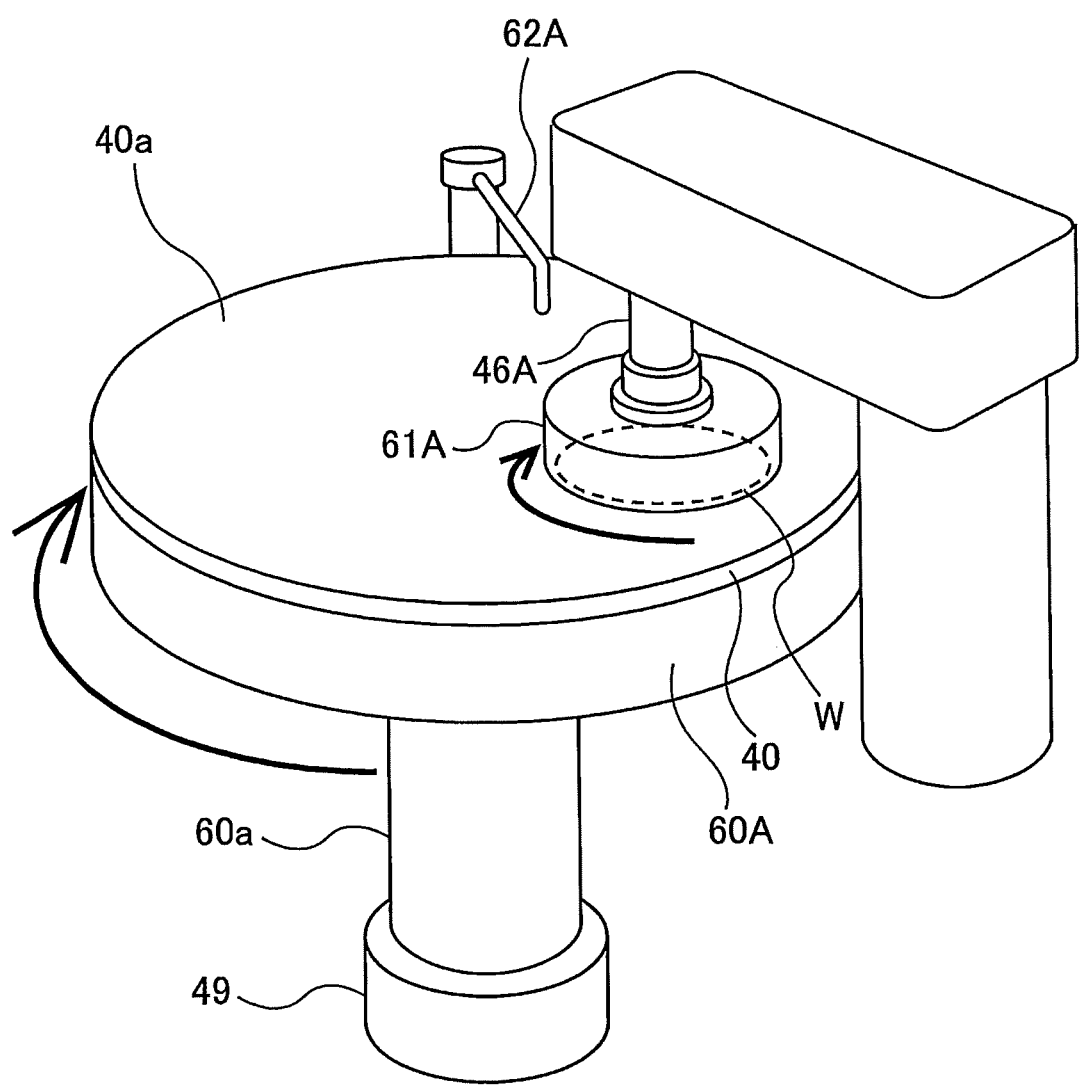
FIG. 13 is a perspective view schematically showing a first polishing unit.

The four polishing heads 61A, 61B, 61C, and 61D have different structures as will be described later, while the first polishing unit 33A, the second polishing unit 33B, the third polishing unit 33C, and the fourth polishing unit 33D have basically the same configuration as a whole. Therefore, the first polishing unit 33A will be described below with reference to FIG. 13. FIG. 13 is a perspective view schematically showing the first polishing unit 33A. In FIG. 13, the dresser 63A and the atomizer 64A are not depicted.

The polishing table 60A is coupled to a table motor 49 through a table shaft 60a, so that the polishing table 60A is rotated by the table motor 49 in a direction indicated by arrow. The table motor 49 is located below the polishing table 60A. The polishing pad 40 is attached to an upper surface of the polishing table 60A. The polishing pad 40 has an upper surface, which provides a polishing surface 40a for polishing a wafer W. The polishing head 61A is secured to a lower end of a head shaft 46A. The polishing head 61A is configured to be able to hold the wafer W on its lower surface by vacuum suction. The head shaft 46A is elevated and lowered by an elevating mechanism (not shown).

Polishing of the wafer W is performed as follows. The polishing head 61A and the polishing table 60A are rotated in directions as indicated by arrows, while the polishing liquid (i.e., the slurry) is supplied onto the polishing pad 40 from the polishing liquid supply nozzle 62A. In this state, the polishing head 61A presses the wafer W against the polishing surface 40a of the polishing pad 40. The surface of the wafer W is polished by a mechanical action of abrasive grains contained in the polishing liquid and a chemical action of the polishing liquid. After polishing of the wafer W, dressing (or conditioning) of the polishing surface 40a is performed by the dresser 63A. Further, high-pressure fluid is supplied from the atomizer 64A onto the polishing surface 40a to remove polishing debris and the abrasive grains remaining on the polishing surface 40a.

Referring back to FIG. 12, a first linear transporter 46 is arranged adjacent to the first polishing unit 33A and the second polishing unit 33B. This first linear transporter 46 is configured to transport the wafer between four transfer positions (i.e., a first transfer position TP1, a second transfer position TP2, a third transfer position TP3, and a fourth transfer position TP4). A second linear transporter 47 is arranged adjacent to the third polishing unit 33C and the fourth polishing unit 33D. This second linear transporter 47 is configured to transport the wafer between three transfer positions (i.e., a fifth transfer position TP5, a sixth transfer position TP6, and a seventh transfer position TP7).

The wafer is transported to the polishing units 33A and 33B by the first linear transporter 46. The polishing head 61A of the first polishing unit 33A is moved between a position above the polishing table 60A and the second transfer position TP2 by a swinging motion of the polishing head 61A. Therefore, transferring of the wafer between the polishing head 61A and the first linear transporter 46 is performed at the second transfer position TP2.

Similarly, the polishing head 61B of the second polishing unit 33B is moved between a position above the polishing table 60B and the third transfer position TP3, and transferring of the wafer between the polishing head 61B and the first linear transporter 46 is performed at the third transfer position TP3. The polishing head 61C of the third polishing unit 33C is moved between a position above the polishing table 60C and the sixth transfer position TP6, and transferring of the wafer between the polishing head 61C and the second linear transporter 47 is performed at the sixth transfer position TP6. The polishing head 61D of the fourth polishing unit 33D is moved between a position above the polishing table 60D and the seventh transfer position TP7, and transferring of the wafer between the polishing head 61D and the second linear transporter 47 is performed at the seventh transfer position TP7.

A lifter 41 for receiving the wafer from the transfer robot 52 is provided adjacent to the first transfer position TP1. The wafer is transported from the transfer robot 52 to the first linear transporter 46 via the lifter 41. A shutter (not shown) is provided on the partition 31a at a position between the lifter 41 and the transfer robot 52. When the wafer is to be transported, this shutter is opened to allow the transfer robot 52 to deliver the wafer to the lifter 41.

A swing transporter 42 is provided between the first linear transporter 46, the second linear transporter 47, and the cleaning section 34. Transporting of the wafer from the first linear transporter 46 to the second linear transporter 47 is performed by the swing transporter 42. The wafer is transported to the third polishing unit 33C and/or the fourth polishing unit 33D by the second linear transporter 47.

A substrate cleaning apparatus 72, which is discussed previously, is disposed beside the swing transporter 42. As shown in FIG. 12, the substrate cleaning apparatus 72 is arranged adjacent to the first linear transporter 46 and located between the first linear transporter 46 and the cleaning section 34. The swing transporter 42 is configured to transport the wafer between the fourth transfer position TP4, the fifth transfer position TP5, and the substrate cleaning apparatus 72.

The wafer that has been polished by at least one of the first polishing unit 33A, the second polishing unit 33B, the third polishing unit 33C, and the fourth polishing unit 33D is transported to the substrate cleaning apparatus 72 by the first linear transporter 46 or the second linear transporter 47, and by the swing transporter 42. The wafer is placed on the substrate supporting structure 1 of the substrate cleaning apparatus 72 by the swing transporter 42. As described above, the substrate cleaning apparatus 72 supplies the cleaning liquid (preferably, pure water) onto the wafer while causing the wafer to vibrate at the natural frequency of the wafer, thus removing the fine particles from the wafer.

The wafer that has been cleaned by the substrate cleaning apparatus 72 is transported to the cleaning section 34 by a first transfer robot 77. The substrate cleaning apparatus 72, located between the polishing section 33 and the cleaning section 34, also serves as a temporary placement stage or a buffer station on which the wafer is temporarily placed.

As shown in FIG. 12, the cleaning section 34 includes a first cleaning unit 73 and a second cleaning unit 74 for cleaning the polished wafer, and a drying unit 75 for drying the cleaned wafer. Each of the first cleaning unit 73 and the second cleaning unit 74 is a roll-sponge-type cleaning unit configured to rub a rotating sponge roll against a rotating wafer while supplying a cleaning liquid onto the wafer. The second cleaning unit 74 may be a pen-sponge-type cleaning unit configured to rub a rotating pen-type sponge against a rotating wafer while supplying a cleaning liquid onto the wafer.

The first transfer robot 77 is operable to transport the wafer from the substrate cleaning apparatus 72 to the first cleaning unit 73 and further transport the wafer from the first cleaning unit 73 to the second cleaning unit 74. A second transfer robot 78 is disposed between the second cleaning unit 74 and the drying unit 75. The second transfer robot 78 is operable to transport the wafer from the second cleaning unit 74 to the drying unit 75.

Next, the operation of the substrate processing apparatus will be described below. The transfer robot 52 takes out a wafer from the substrate cassette and transfers the wafer to the first linear transporter 46. The wafer is transported to at least one of the polishing units 33A to 33D via the first linear transporter 46 and/or the second linear transporter 47. The wafer is polished in at least one of the polishing units 33A to 33D.

The polished wafer is transported to the substrate cleaning apparatus 72 via the first linear transporter 46 or the second linear transporter 47 and via the swing transporter 42, and is cleaned in the substrate cleaning apparatus 72. The wafer is transported from the substrate cleaning apparatus 72 to the first cleaning unit 73 and the second cleaning unit 74 by the transfer robot 77. The wafer is further cleaned by the first cleaning unit 73 and the second cleaning unit 74. The cleaned wafer is transported to the drying unit 75 by the transfer robot 78, and is dried by the drying unit 75.

The dried wafer is removed from the drying unit 75 by the transfer robot 52, and is returned to the substrate cassette on the front load section 50. In this manner, a series of processes including polishing, cleaning, and drying of the wafer is performed.

The cleaning section 34 is an area where a high cleanliness is required. According to the embodiment, the polished wafer is pre-cleaned in the substrate cleaning apparatus 72 before the polished wafer is transported to the cleaning section 34. Therefore, an amount of particles, such as the polishing debris and the abrasive grains, carried together with the wafer into the cleaning section 34 can be reduced. As a result, the cleanliness in the cleaning section 34 can be maintained.

The first linear transporter 46, the second linear transporter 47, the swing transporter 42, and the transfer robots 77 and 78 constitute a transporting mechanism for transporting a wafer from at least one of the polishing units 33A to 33D to the substrate cleaning apparatus 72 and from the substrate cleaning apparatus 72 to the first cleaning unit 73 and the second cleaning unit 74. An operation of the transporting mechanism is controlled by the operation controller 35.

Figure 14:
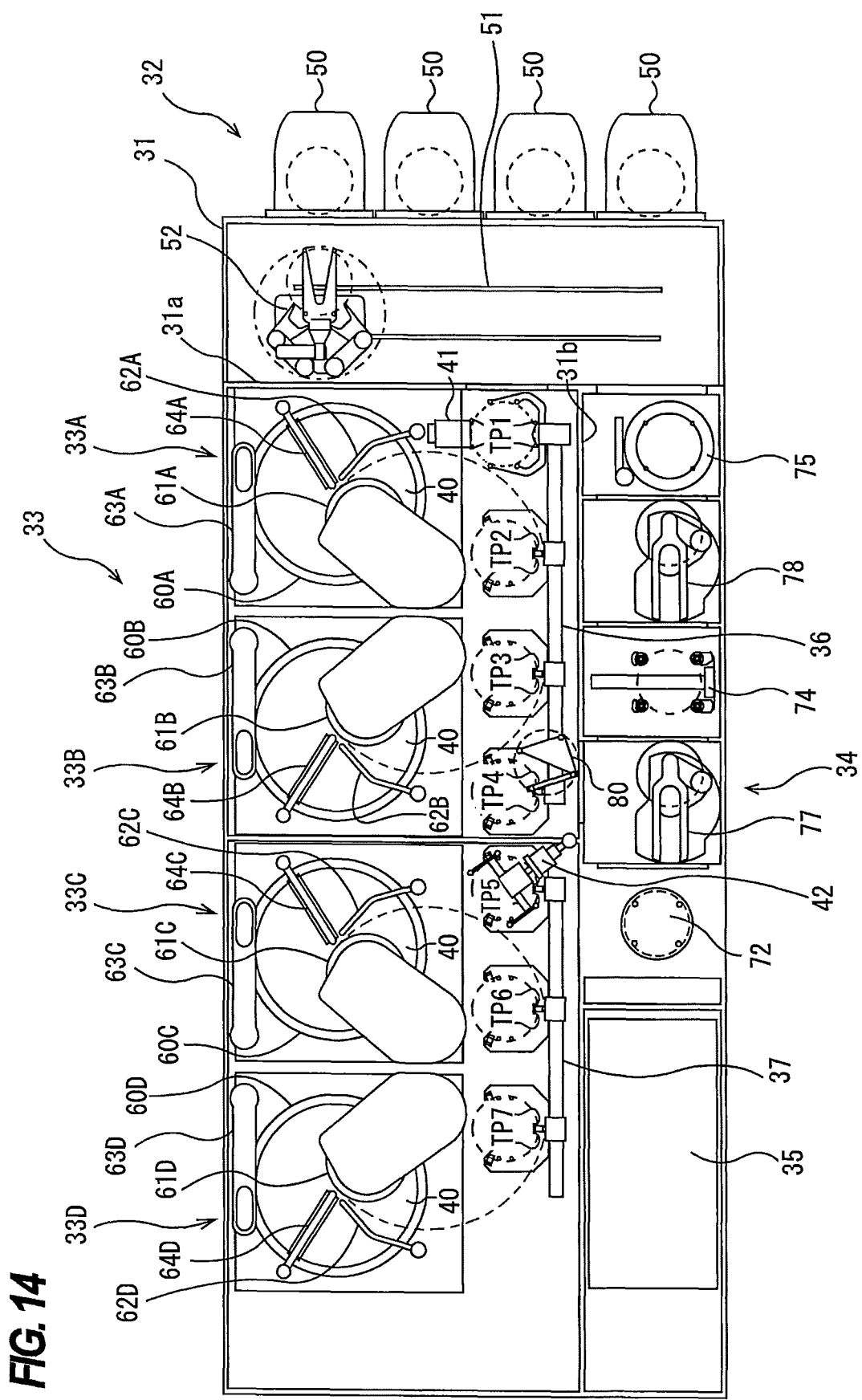
FIG. 14 is a view showing another embodiment of the substrate processing apparatus.

FIG. 14 is a view showing another embodiment of the substrate processing apparatus. In this embodiment, a first cleaning unit of the cleaning section 34 is constituted by the substrate cleaning apparatus 72. A buffer station (temporary placement stage) 80, having no cleaning function, is disposed between the polishing section 33 and the cleaning section 34. The polished wafer is transported to the buffer station 80 via the first linear transporter 46 or the second linear transporter 47 and via the swing transporter 42. The wafer is transported from the buffer station 80 to the substrate cleaning apparatus 72 as the first cleaning unit and the second cleaning unit 74 by the transfer robot 77, and is cleaned by the substrate cleaning apparatus 72 and the second cleaning unit 74. The cleaned wafer is transported to the drying unit 75 by the transfer robot 78, and is dried in the drying unit 75.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate cleaning apparatus comprising:
a substrate supporting structure having a plurality of pillars configured to support a periphery of a substrate;
a vibration device secured to one of the plurality of pillars of the substrate supporting structure;
a vibration controller configured to cause the vibration device to vibrate while continuously changing a vibration frequency of the vibration device over a frequency band including a plurality of natural frequencies of the substrate to vibrate the substrate at least at the plurality of natural frequencies of the substrate;
a first cleaning liquid supply nozzle configured to supply a cleaning liquid onto an upper surface of the substrate; and
a second cleaning liquid supply nozzle configured to supply a cleaning liquid onto a lower surface of the substrate.

2. The substrate cleaning apparatus according to claim 1, further comprising:
a natural frequency detector configured to detect the natural frequency of the substrate when the substrate is supported by the substrate supporting structure.

3. The substrate cleaning apparatus according to claim 2, wherein:
the natural frequency detector includes a vibration detector secured to the substrate supporting structure, and a natural frequency determiner configured to determine the natural frequency of the substrate based on an amplitude of a vibration detected by the vibration detector.

4. A substrate processing apparatus comprising:
a polishing unit configured to polish a substrate;
a cleaning unit configured to clean the substrate;
a substrate cleaning apparatus according to claim 1; and
a transporting mechanism configured to transport the substrate from the polishing unit to the substrate cleaning apparatus and from the substrate cleaning apparatus to the cleaning unit.

5. A substrate processing apparatus comprising:
a polishing unit configured to polish a substrate;
a cleaning unit configured to clean the substrate, the cleaning unit comprising a substrate cleaning apparatus according to claim 1; and
a transporting mechanism configured to transport the substrate from the polishing unit to the cleaning unit.

6. A substrate cleaning apparatus comprising:
a substrate supporting structure having a plurality of pillars configured to support a periphery of a substrate;
a first vibration device secured to one the substrate supporting structure;
a vibration plate opposed to the substrate when the substrate is supported by the substrate supporting structure;
a second vibration device secured to the vibration plate and configured to vibrate the substrate through a gas existing between the vibration plate and a surface of the substrate;
a vibration controller configured to cause the second vibration device to vibrate while continuously changing a vibration frequency of the second vibration device over a frequency band including a plurality of natural frequencies of the substrate to vibrate the substrate at least at the plurality of natural frequencies of the substrate;
a first cleaning liquid supply nozzle configured to supply a cleaning liquid onto an upper surface of the substrate; and
a second cleaning liquid supply nozzle configured to supply a cleaning liquid onto a lower surface of the substrate.

7. The substrate cleaning apparatus according to claim 6, further comprising:
a natural frequency detector configured to detect the natural frequency of the substrate when the substrate is supported by the substrate supporting structure.

8. The substrate cleaning apparatus according to claim 7, wherein:
the natural frequency detector includes a vibration detector secured to the substrate supporting structure, and a natural frequency determiner configured to determine the natural frequency of the substrate based on an amplitude of a vibration detected by the vibration detector.

9. A substrate processing apparatus comprising:
a polishing unit configured to polish a substrate;
a cleaning unit configured to clean the substrate;
a substrate cleaning apparatus according to claim 6; and
a transporting mechanism configured to transport the substrate from the polishing unit to the substrate cleaning apparatus and from the substrate cleaning apparatus to the cleaning unit.

10. A substrate processing apparatus comprising:
a polishing unit configured to polish a substrate;

a cleaning unit configured to clean the substrate, the cleaning unit comprising a substrate cleaning apparatus according to claim 7; and a transporting mechanism configured to transport the substrate from the polishing unit to the cleaning unit.

11. A substrate cleaning method comprising:

supporting a periphery of a substrate with a plurality of pillars of a substrate supporting structure;

causing a vibration device, which is secured to one of the plurality of pillars of the substrate supporting structure, to vibrate while continuously changing a vibration frequency of the vibration device over a frequency band including a plurality of natural frequencies of the substrate to vibrate the substrate at least at the plurality of natural frequencies of the substrate, thereby forming standing waves with different shapes in the substrate; and supplying a cleaning liquid onto an upper surface and a lower surface of the substrate.

12. The substrate cleaning method according to claim 11, further comprising:

detecting the natural frequency of the substrate when the substrate is supported by the substrate supporting structure.

13. The substrate cleaning method according to claim 12, wherein detecting the natural frequency of the substrate comprises:

causing the vibration device to vibrate while changing its vibration frequency;

detecting a vibration of the substrate supporting structure; and determining the natural frequency of the substrate based on an amplitude of the detected vibration.

14. A substrate cleaning method comprising:

supporting a periphery of a substrate by a plurality of pillars of a substrate supporting structure, with a surface of the substrate opposed to a vibration plate;

causing a first vibration device to vibrate, thereby vibrating the substrate and forming a standing wave in the substrate;

during the vibration of the first vibration device, causing a second vibration device, which is secured to the vibration plate, to vibrate while continuously changing a vibration frequency of the second vibration device over a frequency band including a plurality of natural frequencies of the substrate, thereby vibrating the substrate at least at the plurality of natural frequencies of the substrate through a gas existing between the vibration plate and the surface of the substrate; and supplying a cleaning liquid onto an upper surface and a lower surface of the substrate.

15. The substrate cleaning method according to claim 14, further comprising:

detecting the natural frequency of the substrate when the substrate is supported by the substrate supporting structure.

16. The substrate cleaning method according to claim 15, wherein detecting the natural frequency of the substrate comprises:

causing the vibration device to vibrate while changing its vibration frequency;

detecting a vibration of the substrate supporting structure; and determining the natural frequency of the substrate based on an amplitude of the detected vibration.

\* \* \* \* \*